United States Patent
Hong et al.

(10) Patent No.: US 11,515,874 B2
(45) Date of Patent: Nov. 29, 2022

(54) TOUCH SENSING DEVICE AND ELECTRONIC APPARATUS HAVING REFERENCE SIGNAL UPDATE FUNCTION

(71) Applicant: Samsung Electro-Mechanics Co., Ltd., Suwon-si (KR)

(72) Inventors: Byung Joo Hong, Suwon-si (KR); Joo Yul Ko, Suwon-si (KR); Je Hyuk Ryu, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/088,928

(22) Filed: Nov. 4, 2020

(65) Prior Publication Data

US 2022/0060185 A1    Feb. 24, 2022

(30) Foreign Application Priority Data

Aug. 20, 2020  (KR) .................. 10-2020-0104869

(51) Int. Cl.
*H03K 17/96* (2006.01)
*G06F 3/044* (2006.01)

(52) U.S. Cl.
CPC .......... *H03K 17/962* (2013.01); *G06F 3/044* (2013.01); *H03K 2217/94026* (2013.01); *H03K 2217/94094* (2013.01)

(58) Field of Classification Search
None
See application file for complete search history.

(56) References Cited

U.S. PATENT DOCUMENTS

| 2003/0210235 | A1  | 11/2003 | Roberts |
| 2011/0156800 | A1  | 6/2011  | Lee et al. |
| 2012/0037485 | A1* | 2/2012  | Sitarski ............... H03K 17/962 200/600 |
| 2014/0160038 | A1  | 6/2014  | Lee et al. |
| 2018/0032200 | A1* | 2/2018  | Hong .................. B60Q 1/1484 |
| 2018/0081221 | A1* | 3/2018  | Liu ....................... G06F 3/0362 |
| 2018/0093695 | A1* | 4/2018  | Hattori .................... G01B 7/14 |

(Continued)

FOREIGN PATENT DOCUMENTS

| KR | 10-2004-0102208 A | 12/2004 |
| KR | 10-2008-0091322 A | 10/2008 |

(Continued)

OTHER PUBLICATIONS

Korean Office Action dated Aug. 24, 2021 in counterpart Korean Patent Application No. 10-2020-0104869 (7 pages in English and 5 pages in Korean).

*Primary Examiner* — Christopher R Lamb
(74) *Attorney, Agent, or Firm* — NSIP Law

(57) ABSTRACT

A touch sensing device includes: an oscillation circuit including a sensing inductor disposed inside a touch member, a part of a cover of an electronic device, and generating an oscillation signal according to whether a touch has occurred through the touch member; a signal processor converting the oscillation signal into a digital sensing signal; a reference signal generator updating a reference signal based on the digital sensing signal; and a signal detector outputting a detection signal by detecting whether a touch has occurred through the touch member, using the reference signal and the digital sensing signal.

16 Claims, 12 Drawing Sheets

(56) References Cited

U.S. PATENT DOCUMENTS

2019/0302923 A1* 10/2019 Maru .................... G01D 5/243
2021/0041982 A1    2/2021 Hong et al.

FOREIGN PATENT DOCUMENTS

| KR | 10-2010-0029421 A | 3/2010 |
| KR | 10-2014-0076040 A | 6/2014 |
| KR | 10-2137092 B1 | 7/2020 |

* cited by examiner

TOUCH SENSING DEVICE AND ELECTRONIC APPARATUS HAVING REFERENCE SIGNAL UPDATE FUNCTION

CROSS-REFERENCE TO RELATED APPLICATIONS

This application claims the benefit under 35 § USC 119(a) of Korean Patent Application No. 10-2020-0104869 filed on Aug. 20, 2020 in the Korean Intellectual Property Office, the entire disclosure of which is incorporated herein by reference for all purposes.

BACKGROUND

1. Field

The following description relates to a touch sensing device and an electronic apparatus having a reference signal update function.

2. Description of Related Art

In general, wearable devices are preferred to have thinner, simpler and neater designs. Thus, existing mechanical switches are being eliminated in wearable devices. The elimination of mechanical switches is possible with the implementation of dustproofing and waterproofing technologies, as well as the development of a model having a smooth design and unity of construction.

Currently, a touch-on-metal (ToM) technology implementing touches on metal, a capacitor sensing technology using a touch panel, a micro-electro-mechanical-system (MEMS), micro strain gauge technology, and the like, are being developed. Further, a force or touch function is also being developed.

In the case of a conventional mechanical switch, a large size and space are required internally to implement the switch function, and a conventional mechanical switch may have a structure that is not integral with an external case or a shape protruding outwardly, which causes a disadvantage of not being neat and occupying a lot of space.

In addition, there is a risk of electric shocks due to direct contact with a mechanical switch that is electrically connected. In particular, there is a disadvantage that it may be difficult to implement dustproofing and waterproofing due to the structure of the mechanical switch.

In addition, in a conventional switch device having a touch switch unit replacing a mechanical switch, a level of a signal output due to a temperature change, or the like, may be changed in a state in which the touch switch unit is not operated. In this case, there is a problem of malfunction in a state in which there is an operation when there is no operation intended.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a touch sensing device includes: an oscillation circuit including a sensing inductor disposed inside a touch member that is a part of a cover of an electronic device, the oscillation circuit being configured to generate an oscillation signal according to whether a touch has occurred through the touch member; a signal processor configured to convert the oscillation signal into a digital sensing signal; a reference signal generator configured to update a reference signal based on the digital sensing signal; and a signal detector configured to output a detection signal by detecting whether the touch has occurred through the touch member, based on the reference signal and the digital sensing signal.

The oscillation circuit may further include an inductor circuit including the sensing inductor, and having an inductance according to whether the touch has occurred through the touch member; a capacitor circuit including a capacitor connected to the sensing inductor, and having a capacitance according to whether the touch has occurred through the touch member; and an amplification circuit having a resonance frequency determined by the inductor circuit and the capacitor circuit, and configured to generate an oscillation signal according to whether the touch has occurred through the touch member.

The reference signal generator may include a reference operator; a reference determiner; and a reference setter. The reference operator may be configured to obtain a reference delta value by reading a current reference signal and a current digital sensing signal, after initialization. The reference determiner may be configured to determine whether an absolute value of the reference delta value is equal to zero. The reference setter may be configured to: maintain a previous reference signal, in response to the absolute value of the reference delta value being equal to zero; and, in response to the absolute value of the reference delta value not being equal to zero, compare the absolute value of the reference delta value with a reference maximum change value, and change the reference signal according to a result of the comparing of the absolute value of the reference delta value with the reference maximum change value.

The reference setter may be further configured to: change the reference signal to a current digital sensing signal, in response to the absolute value of the reference delta value being less than the reference maximum change value; add the reference maximum change value to the reference signal, in response to the absolute value of the reference delta value being greater than the reference maximum change value and the reference delta value being positive; and subtract the reference maximum change value from the reference signal, in response to the absolute value of the reference delta value being greater than the reference maximum change value and the reference delta value being negative.

The reference signal generator may be further configured to receive the detection signal, and maintain the reference signal as a previous reference signal in response to the detection signal being at a high level.

The signal detector may include: a first operator configured to subtract the reference signal from the digital sensing signal to generate a first difference signal; and a first detector configured to compare the first difference signal with a first threshold value, and generate a first detection signal having a high level in response to the first difference signal being greater than the first threshold value.

The signal detector may include: a first signal detector configured to detect whether pressing has occurred through the touch member, based on the reference signal and the digital sensing signal; and a second signal detector configured to detect whether contact has occurred through the touch member, based on the reference signal and the digital sensing signal.

The first signal detector may include: a first operator configured to subtract the reference signal from the digital sensing signal to generate a first difference signal; and a first detector configured to compare the first difference signal with a first threshold value, and generate a first detection signal having a high level in response to the first difference signal being greater than the first threshold value. The second signal detector may include: a second operator configured to subtract the reference signal from the digital sensing signal to generate a second difference signal; and a second detector configured to compare the second difference signal with a second threshold value, and generate a second detection signal having a high level in response to the second difference signal being greater than the second threshold value.

The signal detector may be further configured to detect whether a contact has occurred through the touch member and whether a pressing has occurred through the touch member based on the reference signal, the digital sensing signal, and threshold values.

In another general aspect, an electronic device includes: a cover disposed on an outside of the electronic device; a touch switch unit including a touch member that is a part of the cover; an oscillation circuit including a sensing inductor disposed inside the touch member, and configured to generate an oscillation signal according to whether a touch has occurred through the touch member; a signal processor configured to convert the oscillation signal into a digital sensing signal; a reference signal generator configured to update a reference signal based on the digital sensing signal; and a signal detector configured to output a detection signal by detecting whether the touch has occurred through the touch member, based on the reference signal and the digital sensing signal.

The oscillation circuit may include: an inductor circuit including the sensing inductor, and having an inductance according to whether the touch has occurred through the touch member; a capacitor circuit including a capacitor connected to the sensing inductor, and having a capacitance according to whether a touch has occurred through the touch member; and an amplification circuit having a resonance frequency determined by the inductor circuit and the capacitor circuit, and configured to generate an oscillation signal according to whether a touch has occurred through the touch member.

The reference signal generator may include: a reference operator; a reference determiner; and a reference setter. The reference operator may be configured to obtain a reference delta value by reading a current reference signal and a current digital sensing signal, after initialization. The reference determiner may be configured to determine whether an absolute value of the reference delta value is equal to zero. The reference setter may be configured to: maintain a previous reference signal, in response to the absolute value of the reference delta value being equal to zero; in response to the absolute value of the reference delta value not being equal to zero, compare the absolute value of the reference delta value with a reference maximum change value, and change the reference signal according to a result of the comparing of the absolute value of the reference delta value with the reference maximum change value.

The reference setter may be further configured to: change the reference delta value into a current digital sensing signal, in response to the absolute value of the reference delta value being less than the reference maximum change value; add the reference maximum change value to the reference signal, in response to the absolute value of the reference delta value being greater than the reference maximum change value and the reference delta value being positive; and subtract the reference maximum change value from the reference signal, in response to the absolute value of the reference delta value being greater than the reference maximum change value and the reference delta value being negative.

The reference signal generator may be further configured to receive the detection signal, and maintain the reference signal as a previous reference signal in response to the detection signal being at a high level.

The signal detector may include: a first operator configured to generate a first difference signal by subtracting the reference signal from the digital sensing signal; and a first detector configured to compare the first difference with a first threshold value, and generate a first detection signal having a high level in response to the first difference signal being greater than the first threshold value.

The signal detector may include: a first signal detector configured to detect whether pressing has occurred through the touch member, based on the reference signal and the digital sensing signal; and a second signal detector configured to detect whether a contact has occurred through the touch member, based on the reference signal and the digital sensing signal.

The first signal detector may include: a first operator configured to subtract the reference signal from the digital sensing signal to generate a first difference signal; and a first detector configured to compare the first difference signal with a first threshold value, and generate a first detection signal having a high level in response to the first difference signal being greater than the first threshold value. The second signal detector may include: a second operator configured to subtract the reference signal from the digital sensing signal to generate a second difference signal; and a second detector configured to compare the second difference signal with a second threshold value, and generate a second detection signal having a high level in response the second difference signal being greater than the second threshold value.

The signal detector may be further configured to detect whether a contact has occurred through the touch member and whether a pressing has occurred through the touch member based on the reference signal, the digital sensing signal, and threshold values.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
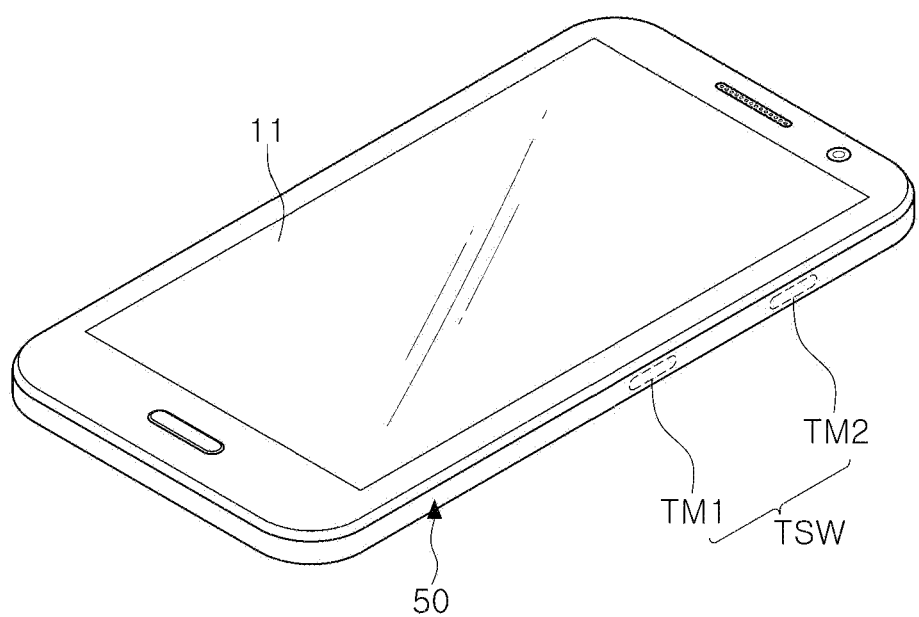
FIG. 1 is a view illustrating an exterior of an electronic device, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

FIG. 1 is a view illustrating an exterior of an electronic device 10, according to an embodiment.

Referring to FIG. 1, an electronic device 10 may include, for example, a cover 50 and a touch switch unit TSW including a first touch member TM1 and a second touch member TM2. Each of the first touch member TM1 and the second touch member TM2 may be a part of the cover 50, and may receive direct contact and pressing by force in order to perform an electronic button function.

In FIG. 1, a case in which the touch switch unit TSW includes the first and second touch members TM1 and TM2 is illustrated, but this is for convenience of description only, and the touch switch unit TSW is not limited to including the first and second touch members TM1 and TM2.

The cover 50 may be a conductor, such as metal, or a non-conductor. For example, when the cover 50 is a conductor, it may not be easy to identify each location for a plurality of touch regions when a touch region for touch is disposed at a plurality of different locations. In contrast, when the cover 50 is a non-conductor such as glass or plastic, when the touch member is disposed on the cover, it is possible to more accurately identify a touch region (or a touch location) through touch detection by contact and touch detection by pressing.

The electronic device 10 may be a portable device, such as a smartphone, or a wearable device, such as a smart watch, and is not limited to a specific device, and may be a portable or wearable electronic device, or an electronic device having a switch for controlling an operation.

The cover 50 may be an outer case such as a housing, or the like, exposed to an outside of the electronic device 10. For example, when a touch sensing device is applied to a mobile device, the cover 50 may be a cover disposed on a side (a side surface) of the electronic device 10. For example, the cover 50 may be integrally formed with a cover disposed on a rear surface of the electronic device 10, or may be formed separately from the cover disposed on the rear surface of the electronic device 10.

As described above, the cover 50 may be an external case other than a front display of the electronic device 10, and is not limited to a specific location, shape, or structure.

Referring to FIG. 1, each of the first and second touch members TM1 and TM2 may be a part of the cover 50, and may be disposed on the cover 50. In this case, the cover may be a cover other than a touch screen, for example, a side cover, a rear cover, or a cover that can be formed on a part of the front surface. For convenience of explanation, a case that is disposed on a side cover of the electronic device 10 is described as an example of the case 50, but the case 50 is not limited to such an example.

For each drawing of the present disclosure, unnecessary and redundant descriptions of components having the same reference numerals and functions may be omitted, and possible differences may be described.

Figure 2:
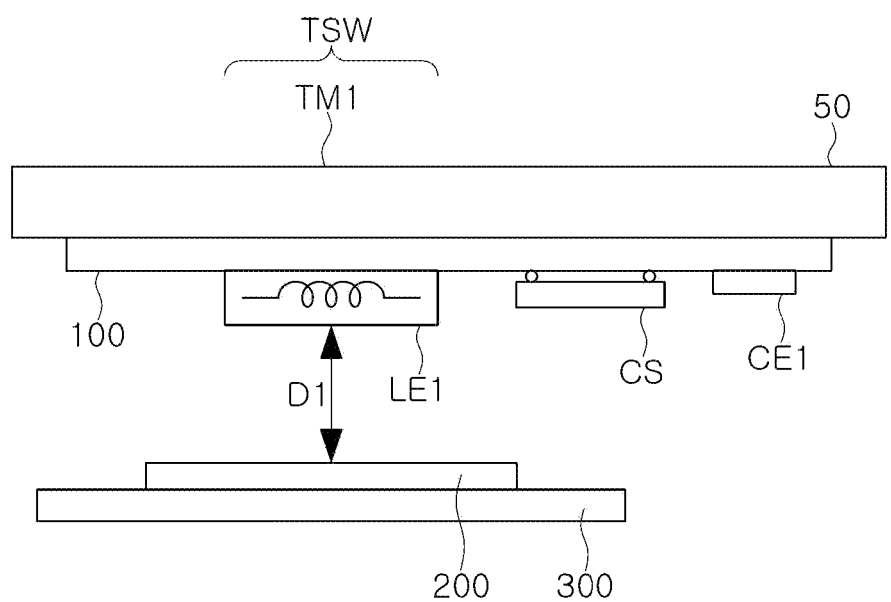
FIG. 2 is a diagram illustrating an internal structure of the electronic device of FIG. 1, according to an embodiment.

FIG. 2 is a diagram illustrating an internal structure of the electronic device 10 of FIG. 1, according to an embodiment.

Referring to FIG. 2, as described above, the electronic device 10 may include the cover 50, the touch switch unit TSW, and the touch sensing device.

The cover 50 may be an outer housing other than a front display. The touch switch unit TSW may include the first and second touch members TM1 and TM2 disposed on a part of the cover 50. The touch sensing device may include a sensing inductor LE1, a capacitor CE1, and a circuit unit CS disposed inside the touch member TM1.

For example, a substrate 100 may be disposed on an inner side surface of the cover 50, and the sensing inductor LE1, the capacitor CE1, and the circuit unit CS may be mounted on the substrate 100. The sensing inductor LE1, the capacitor CE1, and the circuit unit CS may be electrically connected to each other through the substrate 100.

The sensing inductor LE1 may be a coil-type inductor device, but is not limited thereto, and may be a device having inductance.

As an example, the substrate 100 may be a printed circuit board (PCB) or a flexible printed circuit board (FPCB), but is not limited thereto, and may be a board on which a circuit pattern can be formed (e.g., one of various types of circuit boards) or a panel (e.g., a panel for a panel level package (PLP)).

In addition, the touch sensing device may include a conductor 200 disposed to be spaced apart from the sensing inductor LE1 by a predetermined distance D1, and a support member 300 supporting the conductor 200 and supported by an inner frame of the electronic device 10.

FIG. 2 is only a non-limiting example of the internal structure of the electronic device 10, and the sensing inductor LE1 may be disposed inside the cover 50 to detect a touch due to a contact or force due to pressing.

In this disclosure, a touch may include touch corresponding to a contact and a touch corresponding to pressing. Here, contact means a simple contact without pressing force, and pressing means pressing force (or force) following the contact. Therefore, in this disclosure, a touch may include both contact and force (pressing), or may be either one of contact and force.

Figure 3:
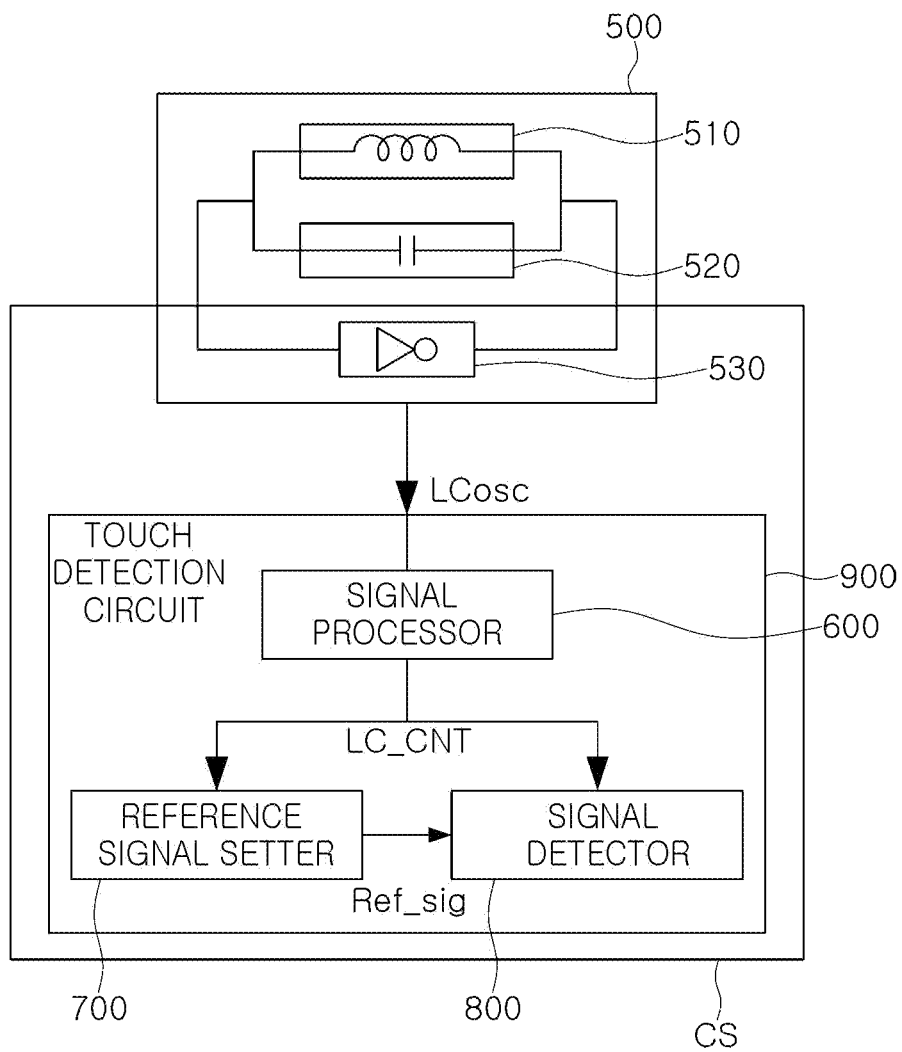
FIG. 3 is a diagram of a touch sensing device, according to an embodiment.

FIG. 3 is a diagram of a touch sensing device, according to an embodiment.

Referring to FIG. 3, the touch sensing device may include an oscillator circuit 500, a signal processor 600, a reference signal generator 700, and a signal detector 800.

The oscillation circuit 500 may include the sensing inductor LE1 disposed inside the touch member TM1, configured to generate an oscillation signal LCosc according to whether a touch has occurred through the touch member TM1.

For example, the oscillation signal LCosc is changed in inductance or capacitance according to whether a touch has occurred through the touch member TM1, so that a resonance frequency is varied. Since the oscillation signal LCosc includes the varied resonance frequency described above, it is possible to detect whether a touch has occurred based on the resonance frequency.

As an example, the oscillation circuit 500 may include an inductor circuit 510, a capacitor circuit 520, and an amplification circuit 530.

The inductor circuit 510 may include the sensing inductor LE1, and may include an inductance according to whether a touch has occurred through the touch member TM1.

The capacitor circuit 520 may include a capacitor CEL1 connected to the sensing inductor LE1, and may include a capacitance according to whether a touch has occurred through the touch member TM1.

The amplification circuit 530 may include a resonance frequency determined by the inductor circuit 510 and the capacitor circuit 520, and may generate an oscillation signal LCosc according to whether a touch has occurred through the touch member TM1.

The signal processor 600 may convert the oscillation signal LCosc into a digital sensing signal LC_CNT.

As an example, the signal processor 600 may generate the digital sensing signal LC_CNT by counting a period of a reference clock CLKref, using the oscillation signal LCosc. Here, a frequency of the reference clock CLKref is lower than a frequency of the oscillation signal LCosc.

The reference signal generator 700 may update a reference signal Ref_sig based on the digital sensing signal LC_CNT.

The signal detector 800 may detect whether a touch has occurred through the touch member TM1, using the reference signal Ref-sig and the digital sensing signal LC_CNT. As shown in FIG. 3, a touch detection circuit 900 may include the signal processor 600, the reference signal generator 700, and the signal detector 800, and the circuit unit CS may include the touch detection circuit 900, and an amplification circuit 530 of the oscillation circuit 500.

In addition, the circuit unit CS may include a capacitor therein, instead of the capacitor CE1 mounted on the substrate 100.

Figure 4:
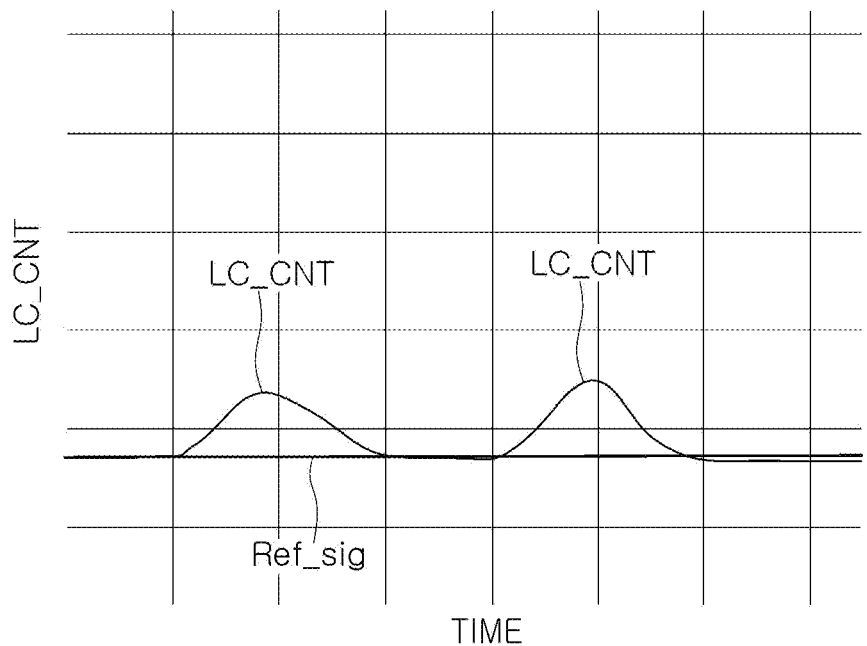
FIG. 4 is a diagram of a digital sensing signal LC_CNT, according to an embodiment.
Figure 5:
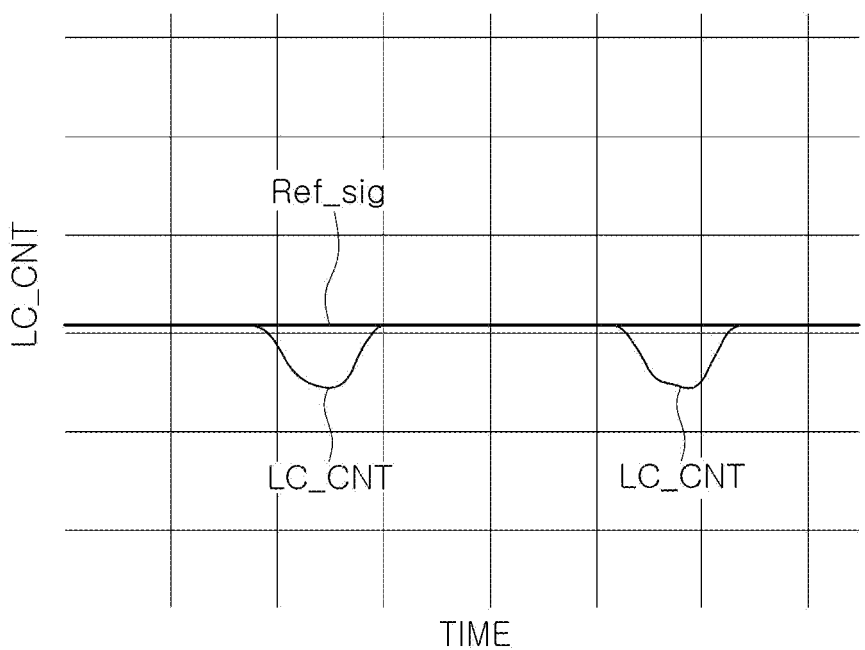
FIG. 5 is a diagram of a digital sensing signal LC_CNT, according to an embodiment

FIG. 4 is a diagram of the digital sensing signal LC_CNT, according to an embodiment. FIG. 5 is a diagram of a digital sensing signal LC_CNT, according to an embodiment.

In FIG. 4, the digital sensing signal LC_CNT has a waveform of a signal output from the signal processor 600 when a pressing is applied through a first touch member TM1.

For example, when pressing is applied through the first touch member TM1, a distance D1 between the sensing inductor LE1 and the conductor 200 changes, an eddy current acts between the sensing inductor LE1 and the conductor 200 according to the change in the distance D1, such that the inductance of the sensing inductor LE1 is reduced, and the resonance frequency of the oscillation signal is increased. As a result, the digital sensing signal LC_CNT includes a change in a signal level in which the signal level increases in response to the pressing.

In FIG. 5, the digital sensing signal LC_CNT has a waveform of a signal output from the signal processor 600 when a contact is applied through the first touch member TM1.

For example, when a contact is applied through a first touch member TM1 by a human body, a parasitic capacitance is generated between the sensing inductor LE1 and the human body (e.g., a human hand), and a capacitance of a capacitor circuit is increased, such that a resonance frequency of the oscillation signal is decreased. As a result, the digital sensing signal LC_CNT includes a change in a signal level in which the signal level decreases in response to the contact.

Figure 6:
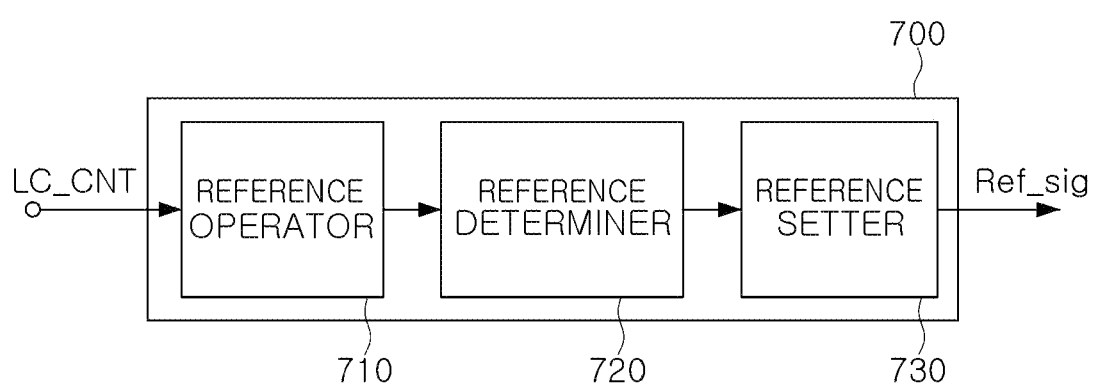
FIG. 6 is a diagram of a reference signal generator, according to an embodiment.
Figure 7:
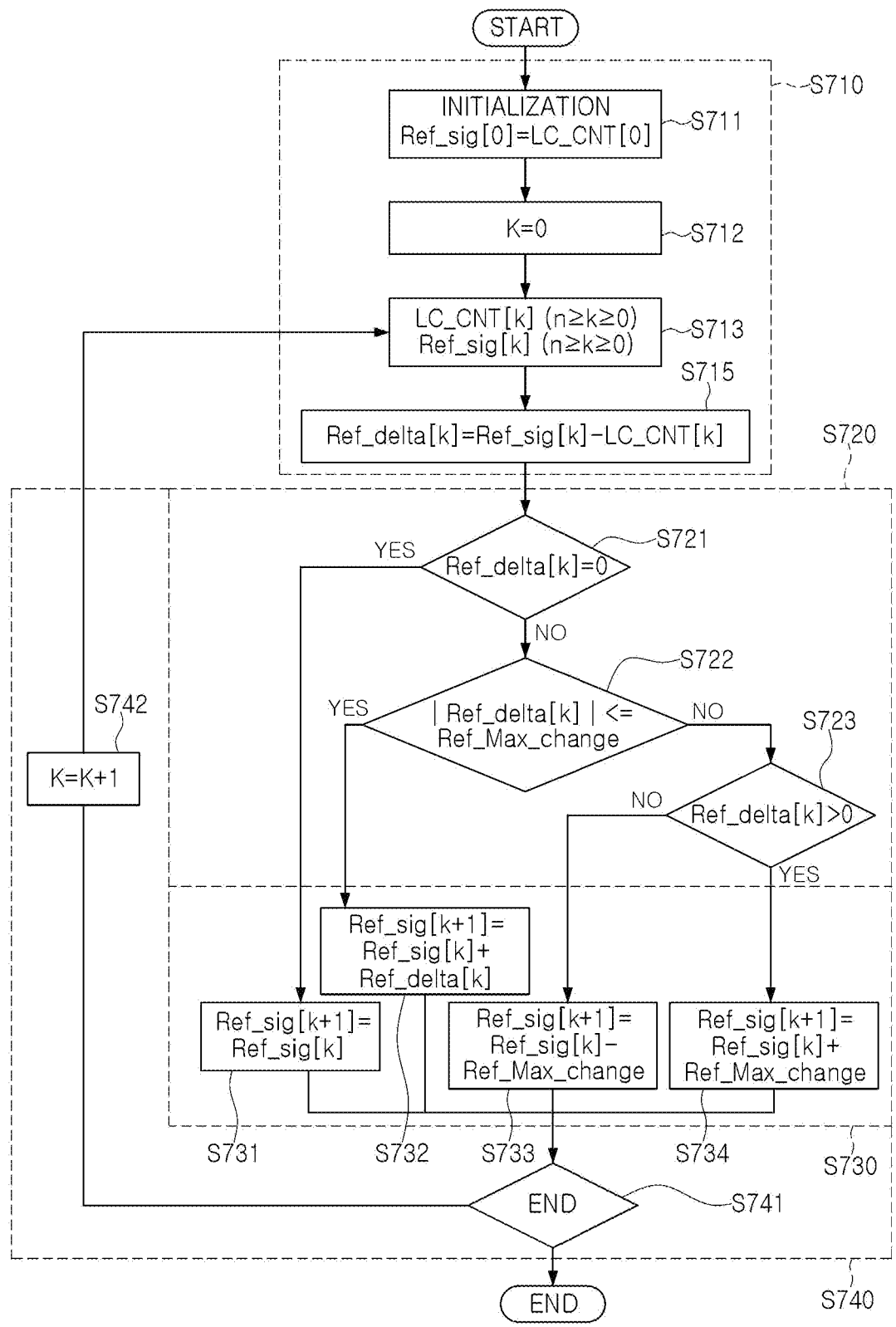
FIG. 7 is a diagram illustrating operations of the reference signal generator of FIG. 6.

FIG. 6 is a diagram of the reference signal generator 700, according to an embodiment. FIG. 7 is a diagram illustrating operations of the reference signal generator 700, according to an embodiment.

Referring to FIG. 6, the reference signal generator 700 may include, for example, a reference operator 710, a reference determiner 720, and a reference setter 730.

Referring to FIG. 7, in operation S710, the reference operator 710 may obtain a reference delta value (Ref_delta[k], 0<=k<=n), by reading a current reference signal (Ref_sig[k], 0<=k<=n) and a current digital sensing signal (LC_CNT[k], 0<=k<=n) from an internal memory, after initialization. (In this example, k is a current state variable, and may be a natural number greater than or equal to zero and less than or equal to n, and n may be a natural number greater than 1. For example, the current reference signal can be changed to Ref_sig[0], Ref_sig[1], Ref_sig[2], . . . , etc. over time, and, also, the current digital sensing signal can be changed to LC_CNT[0], LC_CNT[1], LC_CNT[2], etc. over time.

For example, operation S710 may include operations S711, S712, S713, and S715.

For example, the initialization may correspond to a process of setting an initial digital sensing signal LC_CNT[0], that is initially input, as an initial reference signal Ref_sig[0] in operation S711.

The current state variable k is initialized (k=0) in operation S712, and the reference delta value Ref_delta[k], 0<=k<=n may be obtained by reading the current reference signal Ref_sig[k], 0<=k<=n and the current digital sensing signal LC_CNT[k], 0<=k<=n in operation S713, and subtracting the read current digital sensing signal LC_CNT[k], 0<=k<=n from the read current reference signal Ref_sig[k], 0<=k<=n in operation S715.

The reference determiner 720 may compare an absolute value of the reference delta value Ref_delta[k],0<=k<=n with a determination reference value in operation S720. Operation S720 may include operations S721, S722, and S723.

For example, the reference determiner 720 may perform operation S721 of determining whether the reference delta value Ref_delta[k],0<=k<=n, which is one determination reference value, is equal to zero. If it is determined in operation S721 that the reference delta value Ref_delta[k], 0<=k<=n is not equal to zero, the reference determiner 720 may perform operation S722 of comparing an absolute value of the reference delta value Ref_delta[k], 0<=k<=n to a maximum change value (Ref_Max_change), which is another determination reference value, and determining whether the absolute value of the reference delta value Ref_delta[k], 0<=k<=n is less than or equal to the reference maximum change value Ref_Max_change. If it is determined in operation S722 that the absolute value of the reference delta value Ref_delta[k],0<=k<=n is not less than or equal to the reference maximum change value Ref_Max_change, the reference determiner 720 may perform operation S723 of determining whether the reference delta value Ref_delta[k],0<=k<=n is greater than zero.

The reference maximum change value Ref_Max_change may be a maximum change range allowed for a change in the reference signal.

As a result of the determination of the reference determiner 720, the reference setter 730 may maintain the previous reference signal Ref_sig[k], when the absolute value of the reference delta value Ref_delta[k], 0<=k<=n is equal to zero, and, when the absolute value of the reference delta value Ref_delta[k] is not equal to zero, the reference determiner 720 may be updated by comparing the absolute value of the reference delta value Ref_delta[k],0<=k<=n with the reference maximum change value Ref_Max_change, and changing the reference signal Ref_sig[k] according to the comparison result in operation S730.

For example, operation S730 may include operations S731, S732, S733, and S734.

If it is determined in operation S721 that the reference delta value Ref_delta[k] is equal to zero, the reference setter 730 may update the reference signal Ref_sig[k] according to Ref_sig[k+1]=Ref_sig[k] in operation S731.

If it is determined in operation S721 that the reference delta value Ref_delta[k] is not equal to zero and it is determined in operation S722 that the absolute value of the reference delta value Ref_delta[k] is less than or equal to the reference maximum change value Ref_Max_change, the reference setter 730 may update the reference signal Ref_sig[k] according to Ref_sig[k+1]=Ref_sig[k]+Ref_delta[k] in operation S732.

If it is determined in operation S721 that the reference delta value Ref_delta[k] is not equal to zero, it is determined in operation S722 that the absolute value of the reference delta value Ref_delta[k] is not less than or equal to the reference maximum change value Ref_Max_change, and it is determined in operation S723 that the reference delta value Ref_delta[k] is not greater than zero, the reference setter 730 may update the reference signal Ref_sig[k] according to Ref_sig[k+1]=Ref_sig[k]-Ref_Max_change in operation S733.

On the other hand, if is determined in operation S721 that the reference delta value Ref_delta[k] is not equal to zero, it is determined in operation S722 that the absolute value of the reference delta value Ref_delta[k], 0<=k<=n is not less than or equal to the reference maximum change value Ref_Max_change, and it is determined in operation S723 that the reference delta value Ref_delta[k],$0<=k<=n$ is greater than zero, the reference setter 730 may update the reference signal Ref_sig[k] according to Ref_sig[k+1]=Ref_sig[k]+Ref_Max_change in operation S734.

Then, in operation S740, the reference signal generator 700 may perform an operation S741 of determining whether to end the process. If the process does not end in operation S741, the reference signal generator 700 may perform, in operation S740, an operation S742 of increasing a current state variable K according to K=K+1. After operation S742, the operation S713 of reading the current reference signal Ref_sig[k], $0<=k<=n$ and the current digital sensing signal LC_CNT[k],$0<=k<=n$, the operation S715 of subtracting the read current digital sensing signal LC_CNT[k], $0<=k<=n$ from the read current reference signal Ref_sig[k], $0<=k<=n$, and the operations S720 and S730 are repeated.

More specifically, for example, when the absolute value of the reference delta value Ref_delta[k], $0<=k<=n$ is not equal to zero, the reference setter 730 may compare the absolute value of the reference delta value Ref_delta[k], $0<=k<=n$ with the reference maximum change value Ref_Max_change (operation S722), and if the absolute value of the reference delta value Ref_delta[k], $0<=k<=n$ is less than the reference maximum change value Ref_Max_change, the reference delta value Ref_delta[k] may be added to the reference signal Ref_sig[k] (operation S732 and the reference signal Ref_sig[k] may be updated so as to follow the digital sensing signal LC_CNT[k], n=k.

In addition, when the absolute value of the reference delta value Ref_delta[k], $0<=k<=n$ is greater than the reference maximum change value Ref_Max_change, the reference setter 730 may change the reference signal Ref_sig[k] to a constant value to be updated (operations S733 and S734).

For example, if the reference delta value Ref_delta[k], $0<=k<=n$ is positive, the reference setter 730 may add the reference maximum change value Ref_Max_change to the reference signal Ref_sig[k] (operation S734) to increase the reference signal Ref_sig[k] by the reference maximum change value Ref_Max_change. If the reference delta value Ref_delta[k], $0<=k<=n$ is negative, the reference setter 730 may subtract the reference maximum change value Ref_Max_change to the reference signal Ref_sig[k] (operation S733) to reduce the reference signal Ref_sig[k] by the reference maximum change value Ref_Max_change.

Figure 8:
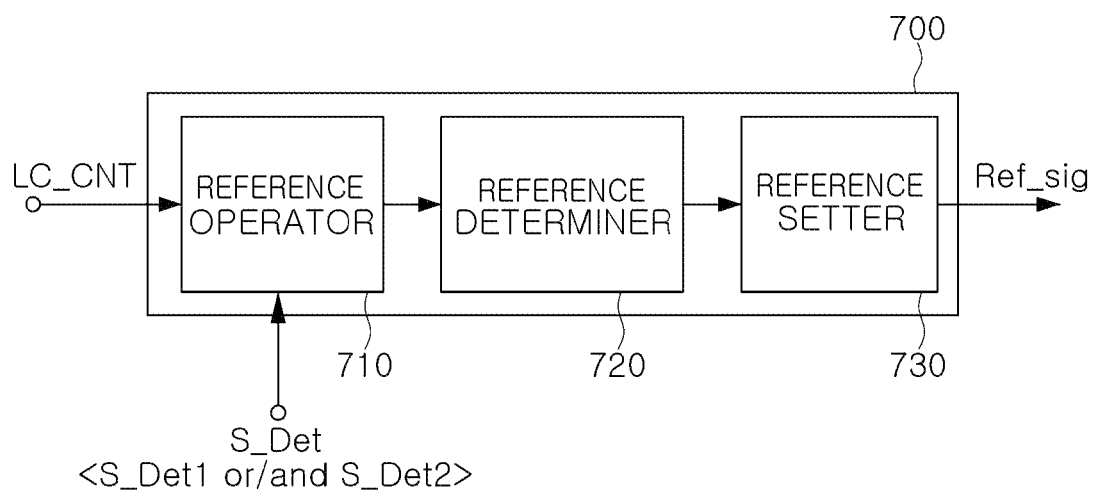
FIG. 8 is a diagram of a reference signal generator, according to an embodiment.
Figure 9:
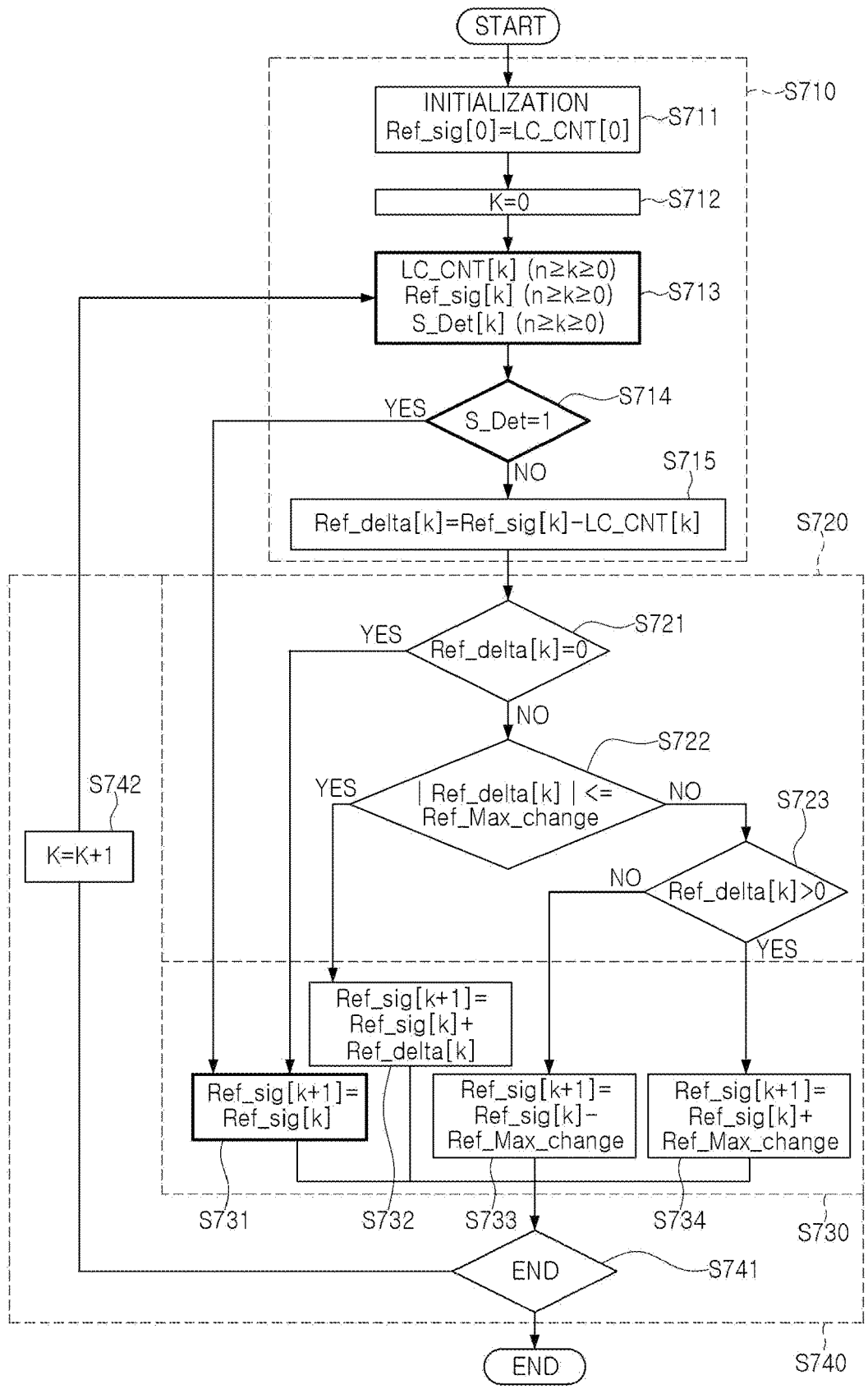
FIG. 9 is a diagram illustrating operations of the reference signal generator of FIG. 8, according to an embodiment.

FIG. 8 a diagram illustrating of a reference signal generator 700-1, according to an embodiment. FIG. 9 is a diagram illustrating operations of the reference signal generator 700-1 of FIG. 8.

The reference signal generator 700-1 shown in FIG. 8 will be described in terms of differences from the reference signal generator 700 shown in FIG. 6.

Referring to FIG. 8, reference signal generator 700-1 may receive the detection signal S_Det and maintain the reference signal Ref_sig[k] as a previous reference signal when the detection signal S_Det is at a high level. For example, as shown in FIG. 9, the reference operator 710 may additionally receive a detection signal S_Det (S_Det1 or/and S_Det2) in operation S713. In this case, it is determined whether the detection signal S_Det (S_Det1 or/and S_Det2) is "1" (high level) in operation S714, and then when the detection signal S_Det (S_Det1 or/and S_Det2) is "1" (high level), the reference setter 730 may perform an operation of maintaining the previous reference signal Ref_sig[k] in operation S731.

Figure 10:
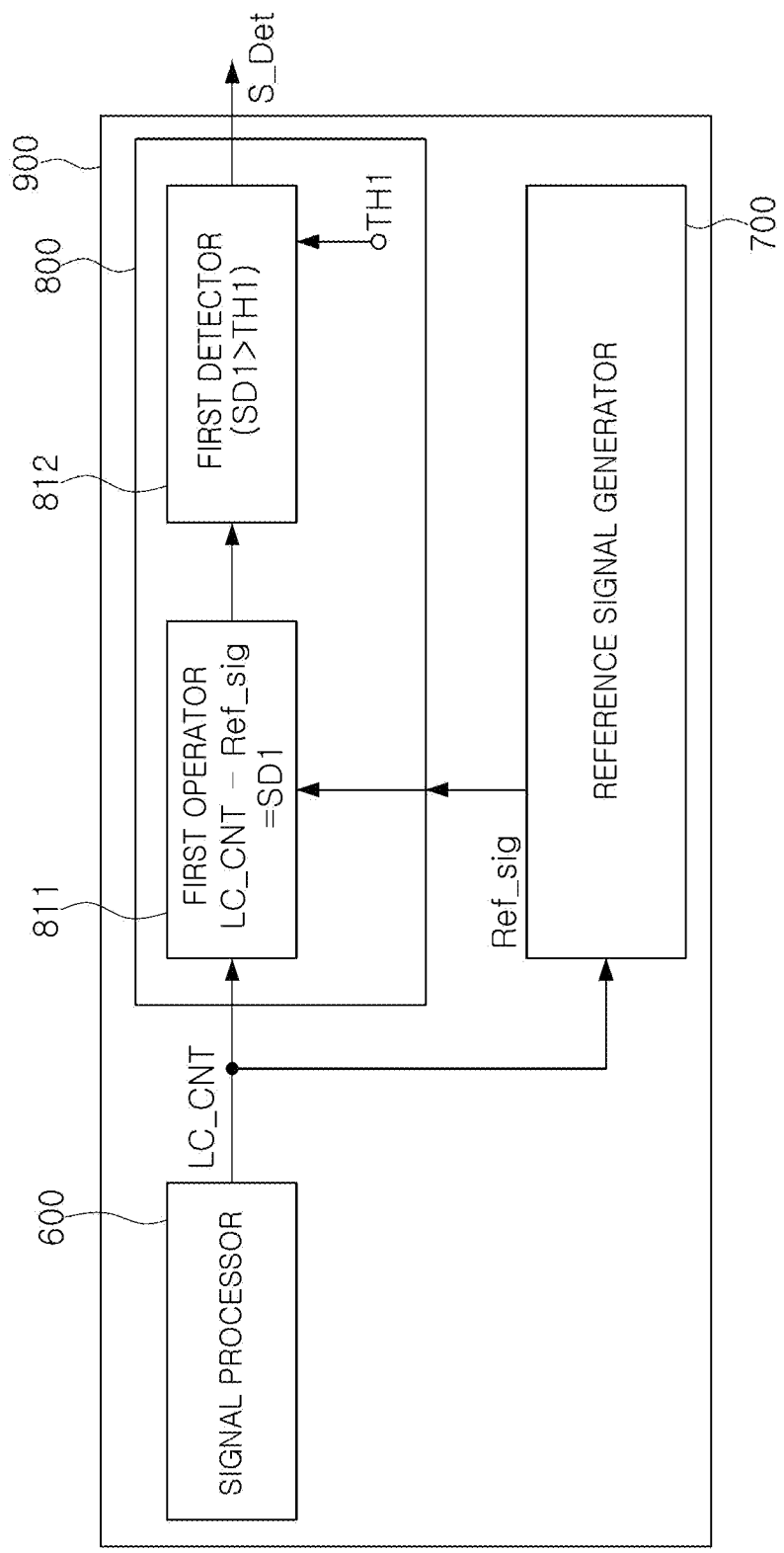
FIG. 10 is a diagram of the touch detection circuit of FIG. 3, according to an embodiment.

FIG. 10 is a diagram of the touch detection circuit 900 of FIG. 3, according to an embodiment.

Referring to FIGS. 3 and 10, the signal detector 800 may include a first operator 811 and a first detector 812.

The first operator 811 may generate a first difference signal SD1 by subtracting the reference signal Ref_sig from the digital sensing signal LC_CNT.

For example, as shown in FIG. 4, the digital sensing signal LC_CNT may include a value that rises greater than the reference signal when force is applied by pressing, and, in this case, a difference value may be a positive. In addition, as shown in FIG. 5, the digital sensing signal LC_CNT may include a value that is less than the reference signal when a touch is applied by contact, and, in this case, a difference value may be a negative.

Although the digital sensing signal LC_CNT is described with reference to FIG. 4, the description is not limited to FIG. 4, and may be applied to the digital sensing signal LC_CNT shown in FIG. 5. The first detector 812 may compare the first difference signal SD1 and a first threshold TH1, such that a first detection signal S_Det1 having a level according to the comparison result with the first difference signal SD1 and the first threshold TH1 may be generated.

For example, for the digital sensing signal LC_CNT shown in FIG. 4, when the first difference signal SD1 is a positive, and when the first difference signal SD1 is greater than the first threshold TH1, a first detection signal S_Det1 having a level may be generated.

As another example, with respect to the digital sensing signal LC_CNT shown in FIG. 5, when the first difference signal SD1 is a negative, and when the first difference signal SD1 is less than the first threshold value TH1, a first detection signal S_Det1 having a high level may be generated.

For example, the first detector 812 may perform touch detection for the input digital sensing signal LC_CNT by performing a hysteresis comparison function having different upper and lower threshold values.

Figure 11:
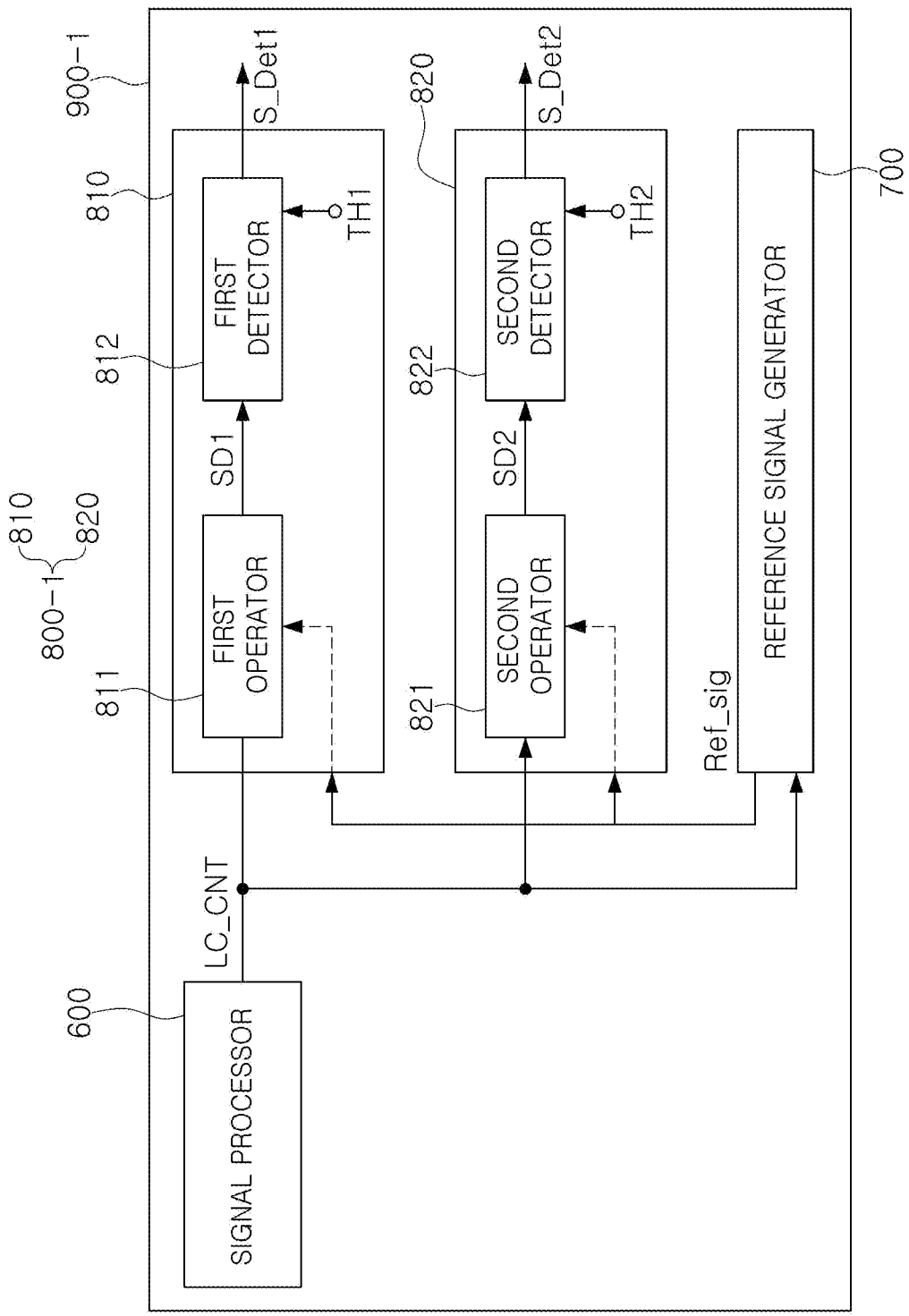
FIG. 11 is a diagram of a touch detection circuit, according to an embodiment.

FIG. 11 is a diagram of a touch detection circuit 900-1, according to an embodiment.

Referring to FIGS. 8 and 10, a signal detector 800-1 of the touch detection circuit 900-1 may include a first signal detector 810 and a second signal detector 820.

The first signal detector 810 may detect whether pressing has occurred through the touch member TM1, using the reference signal Ref_sig and the digital sensing signal LC_CNT.

For example, the first signal detector 810 may include the first operator 811 and the first detector 812. The first operator 811 may generate the first difference signal SD1 by subtracting the reference signal Ref_sig from the digital sensing signal LC_CNT. The first detector 812 may compare the first difference signal SD1 with the first threshold value TH1. When the first difference signal SD1 is greater than the first threshold value TH1, a first detection signal S_Det1 having a high level may be generated.

For example, the first detector 812 may perform touch sensing for the input digital sensing signal LC_CNT by performing a hysteresis comparison function having different upper and lower threshold values.

The second signal detector 820 may detect whether a contact has occurred through the touch member TM1 using the reference signal Ref_sig and the digital sensing signal LC_CNT.

For example, the second signal detector 810 may include a second operator 821 and a second detector 822. The second operator 821 may generate a second difference signal SD2 by subtracting the reference signal Ref_sig from the digital sensing signal LC_CNT. The second detector 822 may compare the second difference signal SD2 with a second threshold value TH2. When the second difference signal SD2 is greater than the second threshold value TH2, a second detection signal S_Det2 having a high level may be generated.

For example, the second detector 822 may perform touch sensing for the input digital sensing signal LC_CNT by performing a hysteresis comparison function having different upper and lower thresholds.

Figure 12A:
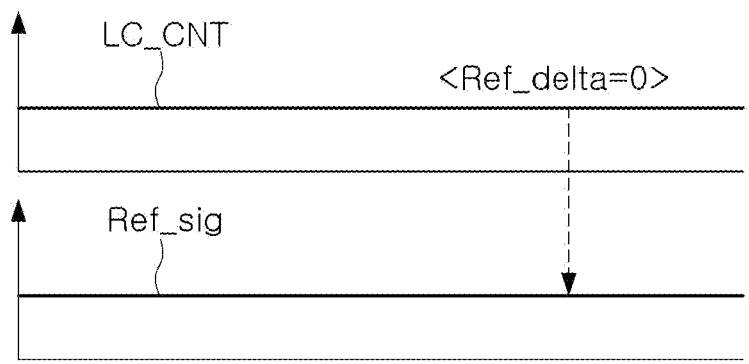
FIG. 12A is a diagram of a digital sensing signal and a reference signal when a reference delta value is zero, according to an embodiment.
Figure 12B:
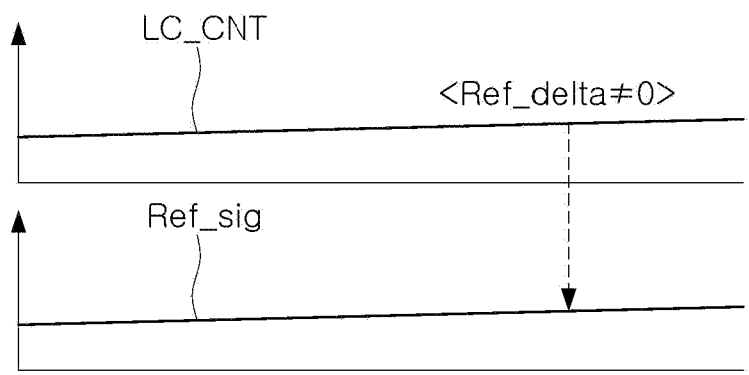
FIG. 12B is a diagram of a digital sensing signal and a reference signal when a reference delta value is not zero and is less than a reference maximum change value, according to an embodiment.
Figure 12C:
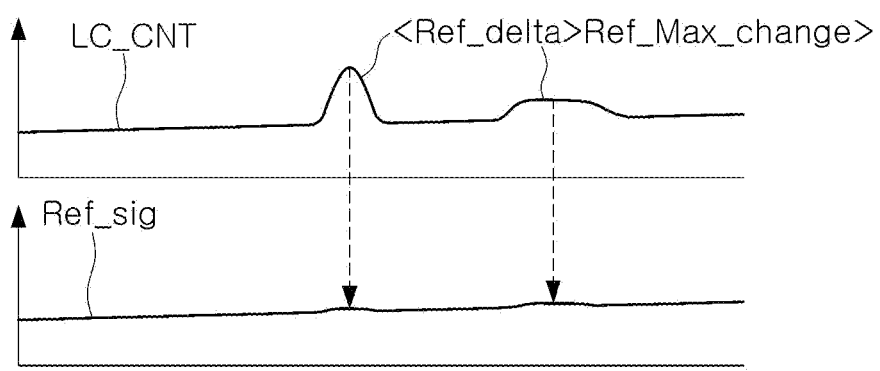
FIG. 12C is A diagram of a digital sensing signal and a reference signal when a reference delta value is higher than a reference maximum change value, according to an embodiment.

FIG. 12A is a diagram of the digital sensing signal LC_CNT and the reference signal Ref_sig when the reference delta value Ref_delta is zero. FIG. 12B is a diagram of the digital sensing signal LC_CNT and the reference signal Ref_sig when the reference delta Ref_delta value is not zero, and is less than the reference maximum change value Ref_Max_change. FIG. 12C a diagram of the digital sensing signal LC_CNT and the reference signal Ref_sig when the reference delta value Ref_delta is greater than the reference maximum change value Ref_Max_change.

Referring to FIG. 12A, when the reference delta value Ref_delta is zero, the reference signal Ref_sig may be maintained as an initial digital sensing signal LC_CNT that is a previous reference value.

Referring to FIG. 12B, when the reference delta value Ref_delta is not zero and is less than the reference maximum change value Ref_Max_change, the reference signal Ref_sig may be changed into the digital sensing signal LC_CNT and updated to follow the digital sensing signal LC_CNT that changes due to characteristic drift.

Referring to FIG. 12C, when the reference delta value Ref_delta is greater than the reference maximum change value Ref_Max_change, the reference signal Ref_sig may be updated by increasing or decreasing to a size limited by a preset reference maximum change value Ref_Max_change so as not to follow the digital sensing signal LC_CNT.

Figure 13A:
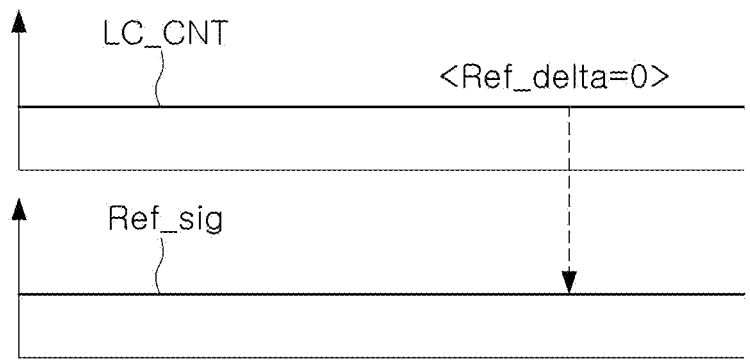
FIG. 13A is a diagram of a digital sensing signal and a reference signal when a reference delta value is zero, according to an embodiment.
Figure 13B:
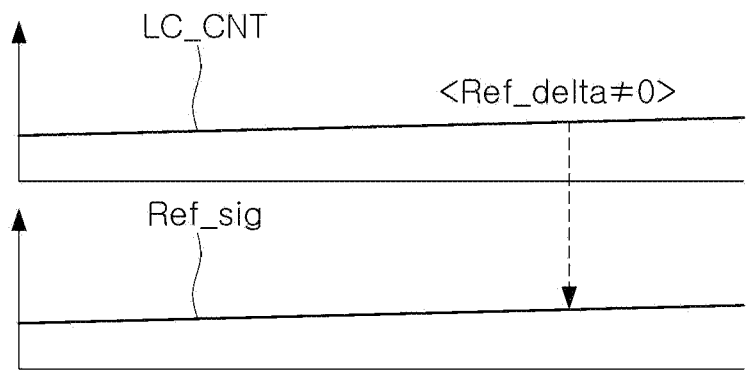
FIG. 13B is a diagram of a digital sensing signal and a reference signal when a reference delta value is not zero and is less than a reference maximum change value, according to an embodiment.
Figure 13C:
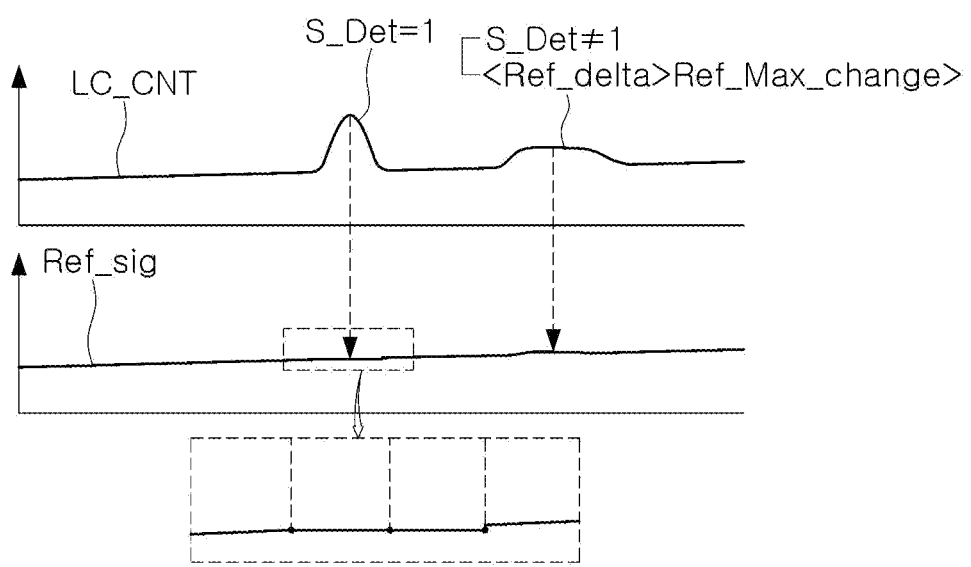
FIG. 13C is a diagram of a digital sensing signal and a reference signal when a detection signal S_Det is at a high level and when a reference delta value is greater than a reference maximum change value, according to an embodiment.

FIG. 13A is a diagram of the digital sensing signal LC_CNT and the reference signal Ref_sig when the reference delta value Ref_delta is zero. FIG. 13B is a diagram of the digital sensing signal LC_CNT and the reference signal Ref_sig when the reference delta value Ref_delta is not zero, and is less than the reference maximum change value Ref_Max_change. FIG. 13C is a diagram of the digital sensing signal LC_CNT and the reference signal Ref_sig when the detection signal S_Det is at a high level and the reference delta value Ref_delta is greater than the reference maximum change value Ref_Max_change.

Referring to FIG. 13A, when the reference delta value Ref_delta is zero, the reference signal Ref_sig may be maintained as an initial digital sensing signal LC_CNT that is a previous reference signal.

Referring to FIG. 13B, when the reference delta value Ref_delta is not zero and is less than the reference maximum change value Ref_Max_change, the reference signal Ref_sig may be changed into the digital sensing signal LC_CNT and updated to follow the digital sensing signal LC_CNT that changes due to a characteristic drift. The terms "characteristic drift" may mean that characteristics such as a reference signal Ref_sig, or the like, are gradually changed due to external environmental changes such as a temperature drift or physical characteristic deformation of the touch switch unit (or an operation unit), or the like.

Referring to FIG. 13C, first, when the detection signal S_Det is at a high level, the reference signal Ref_sig may be maintained as a previous reference signal Ref_sig. As such, while the current touch (e.g., pressing) is performed, the reference signal Ref_sig may not be updated.

In addition, when the reference delta value Ref_delta is greater than the reference maximum change value Ref_Max_change, the reference signal Ref_sig may be updated by increasing or decreasing to a size limited by the preset reference maximum change value Ref_Max_change so as not to follow the digital sensing signal LC_CNT.

As set forth above, according to embodiments disclosed herein, a characteristic drift according to an external environmental change may be compensated for by updating a reference signal based on a digital sensing signal to correspond to the characteristic drift. Accordingly, touch sensing may be more accurately performed.

The signal processor 600, the reference signal setter 700, the reference operator 710, the reference determiner 720, the reference setter 730, the signal detectors 800 and 800-1, the first operator 811, the first detector 812, the second operator 821, and the second detector 822 in FIGS. 1 to 13C that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1 to 13C that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing device, comprising:
    an oscillation circuit comprising a sensing inductor disposed inside a touch member that is a part of a cover of an electronic device, the oscillation circuit being configured to generate an oscillation signal according to whether a touch has occurred through the touch member;
    a signal processor configured to convert the oscillation signal into a digital sensing signal;
    a reference signal generator configured to update a reference signal based on the digital sensing signal; and
    a signal detector configured to output a detection signal by detecting whether the touch has occurred through the touch member, based on the reference signal and the digital sensing signal,
    wherein the reference generator comprises:
    a reference operator configured to obtain a reference delta value by reading a current reference signal and a current digital sensing signal, after initialization;
    a reference determiner configured to determine whether an absolute value of the reference delta value is equal to zero; and
    a reference setter configured to:
       maintain a previous reference signal, in response to the absolute value of the reference delta value being equal to zero; and
       in response to the absolute value of the reference delta value not being equal to zero, compare the absolute value of the reference delta value with a reference maximum change value, and change the reference signal according to a result of the comparing of the absolute value of the reference delta value with the reference maximum change value.

2. The touch sensing device of claim 1, wherein the oscillation circuit further comprises an inductor circuit including the sensing inductor, and having an inductance according to whether the touch has occurred through the touch member;
    a capacitor circuit including a capacitor connected to the sensing inductor, and having a capacitance according to whether the touch has occurred through the touch member; and
    an amplification circuit having a resonance frequency determined by the inductor circuit and the capacitor circuit, and configured to generate an oscillation signal according to whether the touch has occurred through the touch member.

3. The touch sensing device of claim 1, wherein the reference setter is further configured to:
change the reference signal to a current digital sensing signal, in response to the absolute value of the reference delta value being less than the reference maximum change value;
add the reference maximum change value to the reference signal, in response to the absolute value of the reference delta value being greater than the reference maximum change value and the reference delta value being positive; and
subtract the reference maximum change value from the reference signal, in response to the absolute value of the reference delta value being greater than the reference maximum change value and the reference delta value being negative.

4. The touch sensing device of claim 1, wherein the reference signal generator is further configured to receive the detection signal, and maintain the reference signal as a previous reference signal in response to the detection signal being at a high level.

5. The touch sensing device of claim 1, wherein the signal detector comprises:
a first operator configured to subtract the reference signal from the digital sensing signal to generate a first difference signal; and
a first detector configured to compare the first difference signal with a first threshold value, and generate a first detection signal having a high level in response to the first difference signal being greater than the first threshold value.

6. The touch sensing device of claim 1, wherein the signal detector comprises:
a first signal detector configured to detect whether pressing has occurred through the touch member, based on the reference signal and the digital sensing signal; and
a second signal detector configured to detect whether contact has occurred through the touch member, based on the reference signal and the digital sensing signal.

7. The touch sensing device of claim 6, wherein the first signal detector comprises:
a first operator configured to subtract the reference signal from the digital sensing signal to generate a first difference signal; and
a first detector configured to compare the first difference signal with a first threshold value, and generate a first detection signal having a high level in response to the first difference signal being greater than the first threshold value, and
wherein the second signal detector comprises:
a second operator configured to subtract the reference signal from the digital sensing signal to generate a second difference signal; and
a second detector configured to compare the second difference signal with a second threshold value, and generate a second detection signal having a high level in response to the second difference signal being greater than the second threshold value.

8. The touch sensing device of claim 1, wherein the signal detector is further configured to detect whether a contact has occurred through the touch member and whether a pressing has occurred through the touch member based on the reference signal, the digital sensing signal, and threshold values.

9. An electronic device, comprising:
a cover disposed on an outside of the electronic device;
a touch switch unit comprising a touch member that is a part of the cover;
an oscillation circuit comprising a sensing inductor disposed inside the touch member, and configured to generate an oscillation signal according to whether a touch has occurred through the touch member;
a signal processor configured to convert the oscillation signal into a digital sensing signal;
a reference signal generator configured to update a reference signal based on the digital sensing signal; and
a signal detector configured to output a detection signal by detecting whether the touch has occurred through the touch member, based on the reference signal and the digital sensing signal,
wherein the reference signal generator comprises:
a reference operator configured to obtain a reference delta value by reading a current reference signal and a current digital sensing signal, after initialization;
a reference determiner configured to determine whether an absolute value of the reference delta value is equal to zero; and
a reference setter configured to:
maintain a previous reference signal, in response to the absolute value of the reference delta value being equal to zero;
in response to the absolute value of the reference delta value not being equal to zero, compare the absolute value of the reference delta value with a reference maximum change value, and change the reference signal according to a result of the comparing of the absolute value of the reference delta value with the reference maximum change value.

10. The electronic device of claim 9, wherein the oscillation circuit comprises:
an inductor circuit including the sensing inductor, and having an inductance according to whether the touch has occurred through the touch member;
a capacitor circuit including a capacitor connected to the sensing inductor, and having a capacitance according to whether a touch has occurred through the touch member; and
an amplification circuit having a resonance frequency determined by the inductor circuit and the capacitor circuit, and configured to generate an oscillation signal according to whether a touch has occurred through the touch member.

11. The electronic device of claim 9, wherein the reference setter is further configured to:
change the reference delta value into a current digital sensing signal, in response to the absolute value of the reference delta value being less than the reference maximum change value;
add the reference maximum change value to the reference signal, in response to the absolute value of the reference delta value being greater than the reference maximum change value and the reference delta value being positive; and
subtract the reference maximum change value from the reference signal, in response to the absolute value of the reference delta value being greater than the reference maximum change value and the reference delta value being negative.

12. The electronic device of claim 9, wherein the reference signal generator is further configured to receive the detection signal, and maintain the reference signal as a previous reference signal in response to the detection signal being at a high level.

13. The electronic device of claim 9, wherein the signal detector comprises:
   a first operator configured to generate a first difference signal by subtracting the reference signal from the digital sensing signal; and
   a first detector configured to compare the first difference with a first threshold value, and generate a first detection signal having a high level in response to the first difference signal being greater than the first threshold value.

14. The electronic device of claim 9, wherein the signal detector comprises:
   a first signal detector configured to detect whether pressing has occurred through the touch member, based on the reference signal and the digital sensing signal; and
   a second signal detector configured to detect whether a contact has occurred through the touch member, based on the reference signal and the digital sensing signal.

15. The electronic device of claim 14, wherein the first signal detector comprises:
   a first operator configured to subtract the reference signal from the digital sensing signal to generate a first difference signal; and
   a first detector configured to compare the first difference signal with a first threshold value, and generate a first detection signal having a high level in response to the first difference signal being greater than the first threshold value, and wherein the second signal detector comprises:
   a second operator configured to subtract the reference signal from the digital sensing signal to generate a second difference signal; and
   a second detector configured to compare the second difference signal with a second threshold value, and generate a second detection signal having a high level in response the second difference signal being greater than the second threshold value.

16. The electronic device of claim 9, wherein the signal detector is further configured to detect whether a contact has occurred through the touch member and whether a pressing has occurred through the touch member based on the reference signal, the digital sensing signal, and threshold values.

* * * * *